United States Patent [19]

Ono

[11] Patent Number: 5,011,754
[45] Date of Patent: Apr. 30, 1991

[54] PIGMENT-TRANSFER SHEETS AND METHOD FOR DECORATING HEAT-RESISTANT ARTICLES

[75] Inventor: Masayuki Ono, Tokai, Japan
[73] Assignee: INAX Corporation, Aichi, Japan
[21] Appl. No.: 513,776
[22] Filed: Apr. 24, 1990

[30] Foreign Application Priority Data

Apr. 26, 1989 [JP] Japan ................. 1-106818

[51] Int. Cl.⁵ ............ G03C 1/90; G03C 11/12; G03C 11/20
[52] U.S. Cl. ............................ 430/15; 430/14; 430/198; 430/256; 430/259; 430/262; 430/291
[58] Field of Search ........... 430/198, 256, 257, 259, 430/262, 291, 14, 15

[56] References Cited

U.S. PATENT DOCUMENTS

| 52,503 | 2/1866 | Obernetter | 430/198 |
|---|---|---|---|
| 306,470 | 10/1884 | Eastman et al. | 430/259 |
| 332,678 | 12/1885 | Schmalz | 430/198 |
| 1,973,476 | 9/1934 | Fordyce et al. | 430/259 |
| 2,319,102 | 5/1943 | Albers | 430/259 |
| 2,947,626 | 8/1960 | Famely et al. | 430/198 |
| 3,236,647 | 2/1966 | Phillpot | 430/198 |

Primary Examiner—Richard L. Schilling
Attorney, Agent, or Firm—Christopher John Rudy

[57] ABSTRACT

A novel decorating pigment-transfer sheet 1 utilizing at least one photosensitive resin layer 3 and at least one pigment layer deposited thereon is provided for decorating heat-resistant articles 7 such as ceramics. The transfer sheet 1 comprises a water-absorbing substrate sheet 2; a water soluble paste layer 5 placed thereon; at least one and normally three photosensitive resin layers 3 placed thereon, each resin layer 3 having adhesive dot photo-images 3c produced by irradiating the resin layer 3 through a photographic dotted film 6; and at least one and normally three glaze-containing pigment layers (a, b, c) deposited on the adhesive dot images 3c of each resin layer 3. The three pigment layers (a,b,c) normally comprise each pigment of three primary colors, respectively. The heat-resistant article 7 is decorated by soaking the transfer sheet 1 in water, removing the substrate sheet 2, transferring the resin/pigment layers onto the article surface, followed by firing. The resulting pigment patterns on the article 7 have good gradation and resolution in compliance with the photo-images.

20 Claims, 2 Drawing Sheets

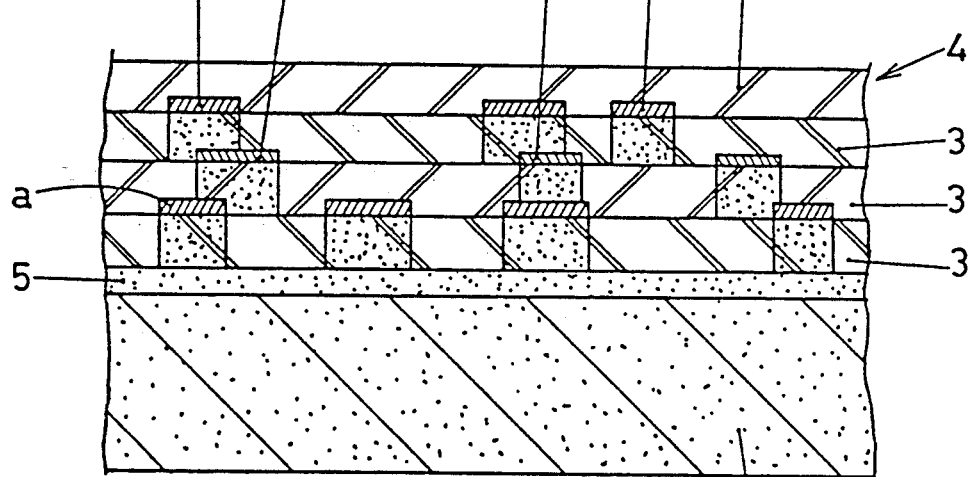
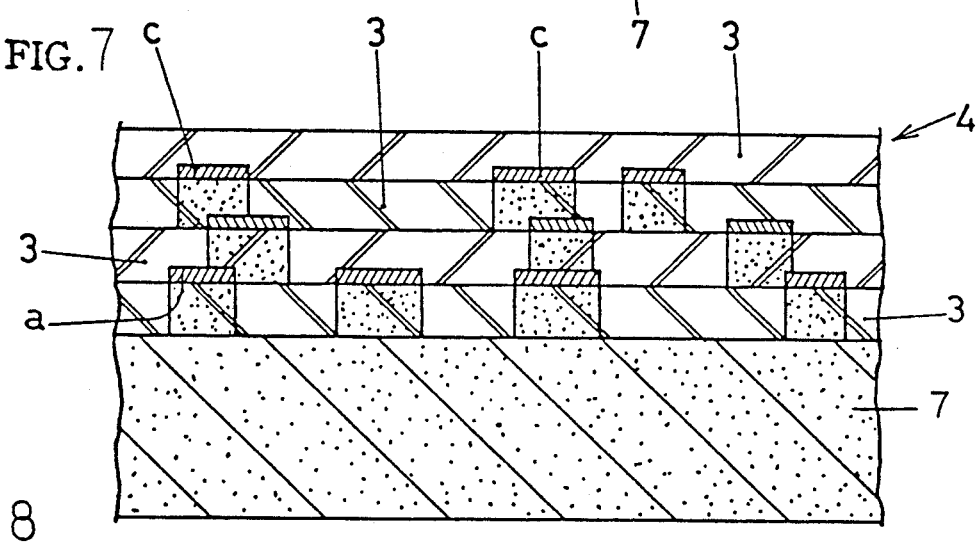
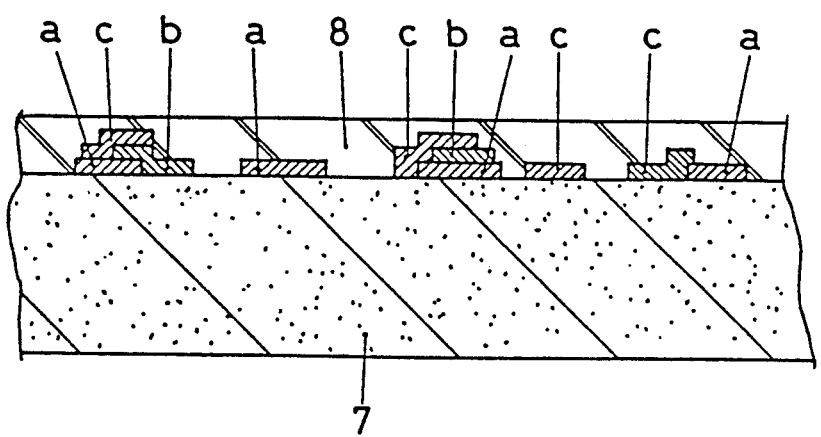

PIGMENT-TRANSFER SHEETS AND METHOD FOR DECORATING HEAT-RESISTANT ARTICLES

BACKGROUND OF THE INVENTION

1. Field of the Invention

This invention relates to a decorating pigment-transfer sheet for heat-resistant articles and a method for decorating heat-resistant articles such as ceramic articles with the transfer sheet.

2. Description of the Prior Art

Hitherto, screen printing has been generally employed for decorating surfaces of ceramic plates such as pottery plates with photographic images. Screen printing methods include a direct method and an indirect method. The direct method comprises directly applying a photosensitive emulsion onto a mesh screen composed of a metal or resin material and then forming a pattern thereon through a color-separated photographic film. The indirect method comprises forming a pattern on a film coated with a photosensitive emulsion through a color-separated photographic film, and then transferring the pattern onto a mesh screen by pressurization. In such screen printing methods, whether a direct method or an indirect method, a mesh screen having a pattern formed thereon is placed on a surface of a pottery plate, and a color pigment paste corresponding to the used color-separated film is provided on the screen. Then, the pigment paste is forced out through the screen by means of a squeezee onto the surface of the pottery plate for printing deposition. In the screen printing, such printing steps are repeated many times corresponding to the number of the desired separated colors to decorate the pottery plate with photographic color images. If a pigment-transfer sheet having photographic images should be known in the art, such a transfer sheet must be screen-printed on a sheet to provide the photographic images and similar to the conventional screen printing methods in printing effects.

In the case of a screen printing method, however, the thickness of the printed pigment becomes very thick because of the openings of mesh screens, for example, as thick as 20 to 100 microns per layer. Thus, a color of an underlying pigment paste can not be seen through an upper layer of another pigment paste having a different color and only the color of a pigment paste in the top layer is observed. Therefore, it has been impossible, for example, to produce an optional synthetic color by applying pigments of three primary colors. In order to provide natural photographic images according to conventional screen printing methods, it was necessary to prepare a large number of color-separated films from an original photographic film and to increase the number of printing screens. Thus, such a method had defects in that a large number of printing mesh screens, printing steps and pigment pastes therefor were needed to provide natural color images. Since each pigment layer is thick, the parts where pigment layers are overlapped become too thick to give unsatisfactory photographic decoration.

Such screen printing methods also have problems in that mesh sizes of the screen are restricted to certain coarse opening sizes and thus the pigment paste passing through the screen according to a printing pattern becomes relatively coarse. As a result, the resolution obtained by the conventional screen printing is about 100 lines/inch or less. Such low resolution is not sufficient for decoration with photographic images. Moreover, according to such screen printing methods, photographic images can be printed only on smooth surfaces of ceramic plates, and can not be printed on uneven rough surfaces thereof.

SUMMARY OF THE INVENTION

An object of the present invention is to provide a decorating pigment-transfer sheet to be used for decorating heat-resistant articles, wherein the above-mentioned problems of the conventional methods are eliminated.

Another object of the invention is to provide a method for decorating a heat-resistant article with a photographic image, which method enables development of a synthetic mixed color by decreasing the thickness of coated pigments, minimizes the working steps and enables decoration of picture having minute (e.g. photographic) gradation and high resolution even on rough surfaces.

The decorating pigment-transfer sheet for decorating heat-resistant articles according to the present invention comprises a water-absorbing substrate sheet, a water-soluble paste layer placed on the substrate sheet, at least one photosensitive resin layer placed on the paste layer and having adhesive dot photo-images, and a glaze-containing pigment layer deposited on the adhesive dot images of each photosensitive layer, whereby the pigment layer having good gradation and high resolution in compliance with the photo-images.

A heat-resistant article can be decorated with a glaze-containing pigment pattern by a method which comprises soaking in water a decorating pigment-transfer sheet comprising a water-absorbing substrate sheet, a water-soluble paste layer placed on the substrate sheet, at least one photosensitive resin layer placed on the paste layer and having adhesive dot photo-images, and at least one glaze-containing pigment layer deposited on the adhesive dot images of each photosensitive layer;

removing the substrate sheet from the transfer sheet, placing the remaining transfer sheet on the surface of the heat-resistant article, removing excess paste and water from the sheet, and drying the resulting sheet and article; and firing the sheet and article at a temperature sufficient to burn away the photo-sensitive resin layer(s) and bond the pigment(s) onto the surface of the article, whereby the resulting pigment patterns having good gradation and high resolution in compliance with the photo-images.

BRIEF DESCRIPTION OF THE DRAWINGS

FIG. 2 shows a cross-sectional view of a photosensitive resin film.

FIG. 6 shows a cross-sectional view of the decorating pigment-transfer sheet placed on a stoneware plate.

FIG. 7 shows a cross-sectional view of the decorating pigment-transfer sheet placed on a stoneware pate, free of excess paste and water.

FIG. 8 shows a cross-sectional view of a stoneware plate decorated with the decorating patterns.

DETAILED DESCRIPTION OF THE INVENTION

Figure 1:
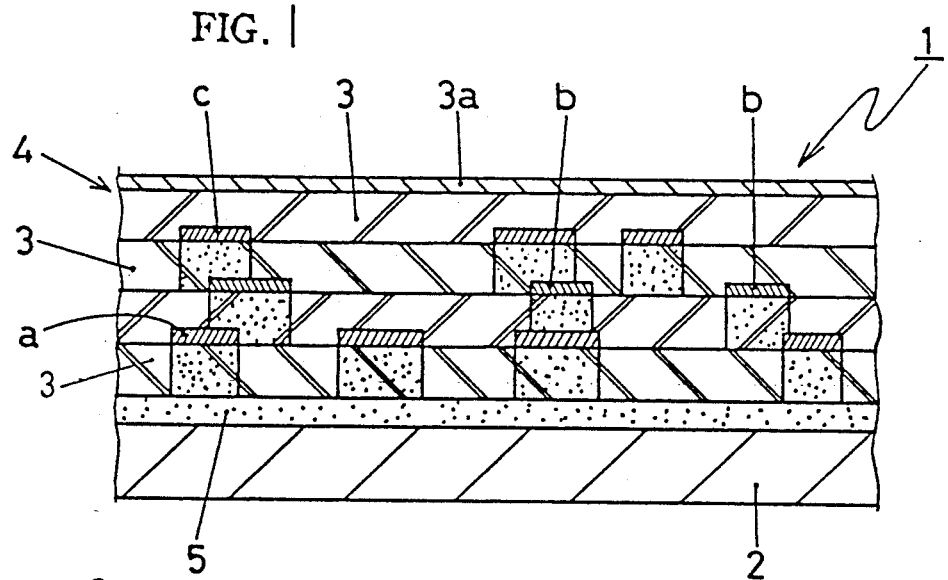
FIG. 1 shows a cross-sectional view of a decorating pigment-transfer sheet according to an embodiment of the invention.

The decorating pigment-transfer sheet according to an embodiment of the invention comprises a laminate containing at least three photosensitive resin layers and three different pigment layers piled up alternately to form at least three layers, usually three or four layers when the transfer sheet is of natural color. On the other hand, when the color of the transfer sheet is monochromatic, the decorating pigment-transfer sheet normally comprises one photosensitive layer and one pigment layer.

Such decorating sheets can be produced by bonding a photosensitive layer onto a water-absorbing substrate sheet with a water-soluble paste, forming an adhesive dot photo-induced image on the photosensitive layer by using a color-separated dotted film (or a monochromatic dotted film in the case of a monochromatic pattern), depositing a predetermined pigment on the adhesive parts of the photosensitive layer, repeating formation of an adhesive dot photo-induced image and deposition of a pigment on the adhesive parts of the photosensitive layers successively corresponding to at least three primary colors when the images are of natural color, and ,as necessary, covering the top surface of the pigment layer with a transparent glaze layer and/or a protecting combustible layer.

The photosensitive resin to be used in the photosensitive layer is a reactive resin which changes its surface properties when the resin is irradiated with electromagnetic waves such as light or actinic rays. These photosensitive resins have been on the market and known as a photo-resist material for chemical milling. The present invention utilizes, as the photosensitive layer for the pigment transfer sheet in view of change in adhesive properties, a photosensitive resin which is adhesive and turns non-adhesive when irradiated with light (in combination with a photo-positive dotted film) or which is non-adhesive and turns adhesive when irradiated with light (in combination with a photo-negative dotted film). These photosensitive resins include, for example, a polymer or copolymer comprising an acrylic compound component(s) such as acrylates, methacrylates, acrylonitrile, methacrylic acid or mixtures thereof. The thickness of the photosensitive resin layer is within a range of 5 to 100 microns, and usually 5 to 25 microns per layer.

The photographic elements for exposure such as photo-positive or negative films to be used for providing adhesive dot images have screen dots to obtain good gradation and resolution. The screen dots are provided by the use of a halftone contact screen for dotting in the course of preparing the photographic element. In the case of the natural-color or multi-color transfer sheet, the color-separated photographic element for exposure is photographically prepared by color-separating an original copy for the images through the corresponding color filter. When the photo-images are monochromatic, a screen-dotted unseparated film is usually used, although a color-separated dotted film can also be used.

The water-soluble paste used herein includes methylcellulose, carboxymethyl cellulose, dextrin, starch and mixtures thereof.

The pigments may be in the form of fine powder or quick-drying paste containing fine powder. The pigments used for the color pattern of natural color are of three primary colors, for example, yellow, magenta (red) and cyan (blue), and as necessary black. For the monochromatic color pattern, a pigment of a desired color can be used., however, a black or sepia pigment is usually used. These pigments usually contain a glaze component in an amount of 5 to 60% and normally 10 to 40% by weight, for example as shown in the following Table.

TABLE

| pigment | | glaze powder (e.g. glass or frit powder) |
| --- | --- | --- |
| yellow (yellow) | 60 | 40 |
| magenta (red) | 60 | 40 |
| cyan (blue) | 70 | 30 |
| black | 90 | 10 |

Each pigment deposit on the adhesive dots with a uniform thickness of not more than about 6 microns and generally about 1 to 4 microns. The gradation of the photoimage color pattern is defined by the size of the adhesive dots having pigments deposited thereon.

A transparent glaze layer may be provided on the top pigment layer to increase durability of the decorated color pattern.

Also, a protecting top layer may be provided on the transfer sheet to protect the decorating sheet. The materials of the protecting layer are those which are adhesive and burn away when an article having the decorating sheet attached thereon is fired to give a glazed pigment pattern on the article. Examples of such materials include an adhesive-backed transparent resin film.

The whole thickness of the decorating sheet (excluding substrate sheet) of the invention is approximately 5 to 25 microns.

The heat resistant articles to be decorated according to the present method are those materials which are resistant to the firing temperature of the glaze-containing pigments used for decoration. Examples of such articles are ceramic articles (e.g. pottery tile, stoneware tile, bone china), fine ceramic articles, crystallized glass plates, metal articles, etc.

By the firing, the photo-sensitive resin as well as other impurities burn away. Since each pigment layer for one of the three primary colors is as thin as 1 to 4 microns, an underlying pigment layer can be seen through upper pigment layer(s) Thus, the parts wherein pigments are overlapped produce a synthetic color. Accordingly, it is possible to produce almost all colors by using pigments of three primary colors.

When the decorating sheet is soaked in water, the water-soluble paste dissolves and serves to bond the sheet onto the article to be decorated. Since the decorating pigment-transfer sheet is directly bonded to a heat-resistant article in the present method, it is possible to decorate articles having uneven surfaces. It is also possible to enhance resolution by about 2 to 5 times in comparison with conventional screen printing methods, because the present method utilizes direct photographic projection.

EXAMPLE

The present invention is further explained by way of the example with reference to the drawings.

FIG. 1 shows a longitudinal cross-sectional view of a decorating pigment-transfer sheet 1 according to an embodiment of the invention. As shown in the drawing, the decorating pigment-transfer sheet 1 comprises a water-absorbing substrate sheet 2, pigment layers (i.e. the first to the third layers) wherein photosensitive resin layers 3 and pigments (a), (b) and (c) are alternately piled up in the form of laminate layers on the substrate sheet 2, and a covering layer 4 (i.e. the fourth layer) which protects the surface of the top pigment layer.

Preparation of the decorating pigment-transfer sheet 1 is shown in FIGS. 2 through 5. At first, a commercially available photosensitive resin film 3 such as CROMALIN film (a trademark of DUPONT, U.S.A.) as shown in FIG. 2 is provided therefor. The photosensitive resin film 3 is of a photosensitive acrylic resin material, the top surface of which is covered with a polyester resin 3a for protection and the back surface of which is covered with a polyethylene resin 3b for protection. Of course, a similar film can be produced as necessary from a commercially available photosensitive resin.

The polyethylene resin 3b at the back of the photosensitive resin film 3 is peeled off, and the photosensitive resin film 3 is bonded to the water-absorbing substrate sheet 2 with a water-soluble paste 5. As the paste 5 can be used methyl cellulose, carboxymethyl cellulose, dextrin, starch paste and mixtures thereof.

Figure 3:
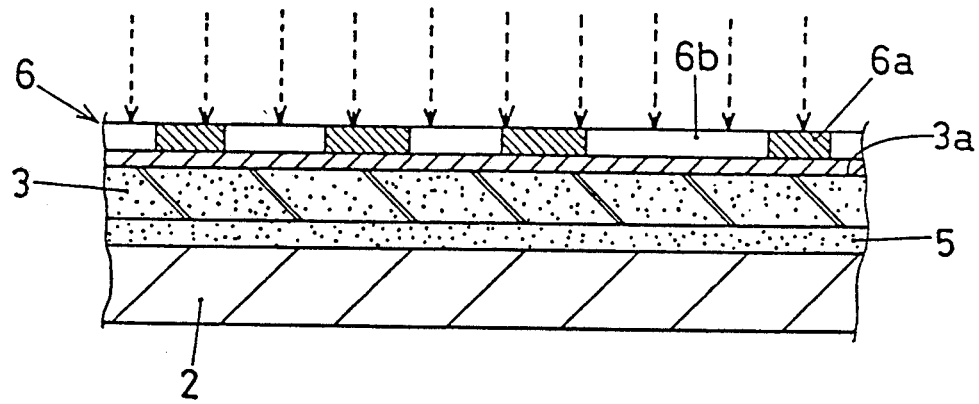
FIGS. 3 through 5 are cross-sectional views of the intermediate structures of the decorating pigment-transfer sheet, which show the structures of the sheet in various preparation steps.
Figure 4:
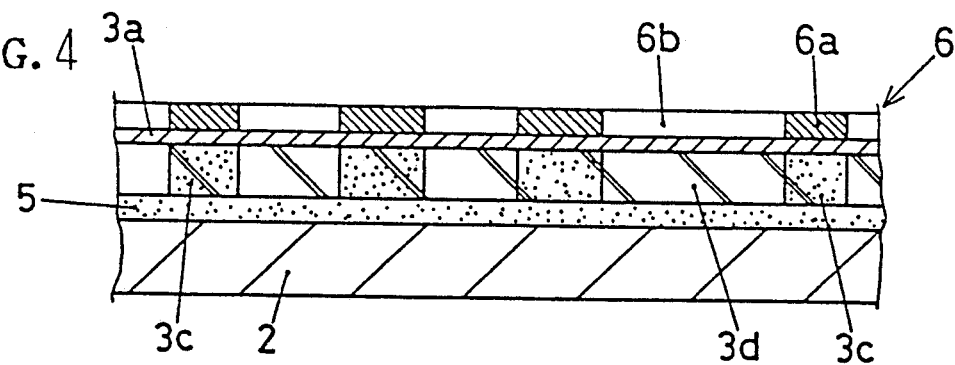

Then, a color-separated photographic film 6 having screen dots is placed on the polyester resin 3a on the surface of the photosensitive resin film as shown in FIG. 3. The color-separated film 6 is one of the films produced by color-separating a photograph to be used for the decoration pattern into three primary colors when natural color patterns are to be decorated and is, for example, a blue color-separated film. Thereafter, UV light is irradiated on the surface of the blue color-separated positive film 6. By such irradiation, the UV light is blocked at black parts of the film 6 but passes through transparent parts 6b thereof. Thus, non-exposed parts 3c and exposed parts 3d are formed in the photosensitive resin film 3 exposed to light as shown in FIG. 4. Namely, dot photo-images are formed Thus, the resin material at the exposed parts 3d to which the UV light has reached is cured, whereas the resin material at the non-exposed parts 3c where the UV light has not reached remains uncured and retains its adhesive property in the form of the dots.

Figure 5:
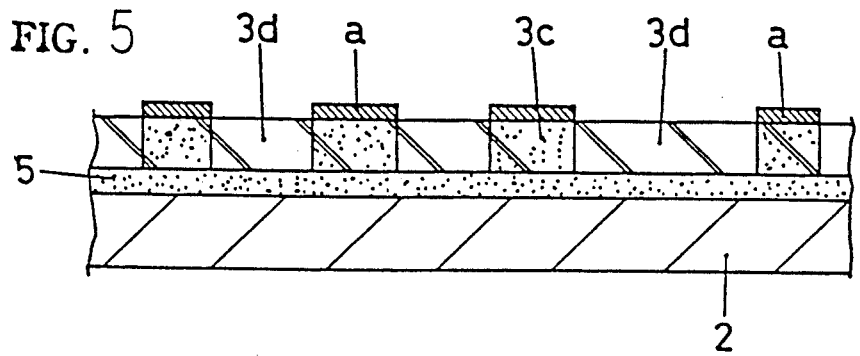

Then, the blue-separated film 6 is removed, and the polyester resin 3a protecting the surface of the photosensitive resin film 3 is peeled off. A powdery blue pigment (a) containing 40% by weight of a transparent glaze component is applied to the whole surface of the photosensitive resin film 3. Since the non-exposed parts 3c of the photosensitive resin film 3 possesses an adhesive property, the blue pigment (a) adheres onto the adhesive dots 3c with a uniform thickness of not more than 6 microns. On the other hand, since the resin material at the exposed parts 3d of the photosensitive resin film 3 has been cured to become non adhesive, the blue pigment (a) on the parts 3d can be readily wiped off by means of a brush or cloth. By wiping off the pigment from the exposed parts 3d, there can be obtained the structure as shown in FIG. 5 wherein the blue pigment (a) is coated only on the non-exposed parts 3c. In other words, the blue pigment (a) is coated on the parts of the surface of the photosensitive resin film 3 corresponding to the black parts 6a of the blue-separated film 6.

In the above-mentioned steps, the first layer as shown in FIG. 1 is formed. The second and third layers are formed by repeating the steps similarly. The second and third layers correspond to the remaining colors of the three primary colors, i.e. red and yellow.

The irradiation with ultra violet rays is generally carried out, for example, with a distance of 1 meter from a UV lamp (1.5K.W.) for 15 to 60 seconds depending on the density of a color-separated dotted film. Incidentally, it is possible to make the pigments (a) through (c) of the first to the third layers as thin as 1 to 4 microns per layer, because these layers are formed without using a conventional screen printing method.

Finally, a top covering layer 4 is formed for protecting the pigment (c) on the surface. The covering layer 4 of the example shown in FIG. 1 uses the photosensitive resin film 3 shown in FIG. 2. Namely, the polyethylene film 3b on the back of the photo-sensitive resin film 3 is peeled off and the film 3 is bonded to the surface of the third layer utilizing a self-bonding property of the resin.

Explained below is a mode of decorating a heat-resistant article with a photographic pattern by using the decorating pigment-transfer sheet 1. First, the protecting polyester film 3a is peeled off from the transfer sheet 1, and the resulting transfer sheet is soaked in water to allow the water-absorbing substrate sheet 2 to absorb water. Thus, the water-soluble paste 5 is dissolved. The substrate sheet 2 of the transfer sheet 1 in such a state is removed from the sheet 1 as shown in FIG. 6. The resulting sheet 1 is placed on the stoneware tile 7 of 20 cm×20 cm×1 cm and is pressed uniformly to the tile 7 by means of a silicone pad to remove excess paste and water, thereby giving a pigment-transferred tile as shown in FIG. 7.

Thereafter, the transferred tile is dried and then fired at a temperature suitable for firing pigments (a) through (c). The firing temperature is usually 800° to 1000° C. In such firing, the photosensitive resin films 3 in the first through fourth layers and impurities such as the paste 5 (which has not been completely removed) are burnt away. The glaze-containing pigments (a) through (c) are directly fused onto the surface of the tile 7 with their predetermined parts overlapped. FIG. 8 shows the pigments (a), (b) and/or (c) deposited on the tile 7 corresponding to each dot of the dotted photo-images. The surfaces of the pigments and/or the resulting decorated tile may be covered with a glass layer 8 derived from a glaze (e.g. frit) component contained in the pigments (a) through (c).

Incidentally, the present invention is not restricted to the above-mentioned example and can be properly modified. For example, the decorating pigment-transfer sheet 1 may be further provided with a photosensitive resin layer having thereon a black pigment deposited by using a color-separated photographic film for black color, between the third layer and the protecting top layer. Also, a glass component may be coated on the top pigment layer. It is also possible to omit the protecting top layer. Moreover, the present invention is not restricted to decoration of pottery or ceramic plates, but can be applied to all the materials resistant to the firing temperature of the glaze-containing pigments used.

The photographic elements of either a positive or negative type can be used as the dotted film for exposure. When the color-separated film used is positive (or negative), a photosensitive resin film 3 which is cured (or becomes adhesive) upon exposure to light can be selectively used, respectively. Instead of the silicone pad used for removing excess paste and water, it is possible to place a flexible film on the decorating pigment-transfer sheet 1 to cover the transfer sheet and tile and then to intimately contact the transfer sheet 1 under vacuum pressure with the tile 7. When the photographic image to be decorated is monochromatic, the pigment layer of the transfer sheet can contain a monochromatic pigment or a mixture thereof.

Main Effects of the Invention:

As explained above, three primary colors are deposited on photosensitive resin films by forming dotted photo-images on the resin films through color-separated photographic films and depositing the corresponding pigments on the resulting adhesive dot images, respectively. Decoration with photographic patterns is carried out by simply bonding the decorating pigment-transfer sheet onto a heat resistant article and firing the resulting article at a temperature suitable for the pigments contained in the decorating sheet. Each of the pigment layers for three primary colors can be as thin as 1 to 4 microns, and thus an underlying pigment layer can be seen through the other pigment layer(s) lying thereon. A synthetic color can be developed at the portions where the pigments are overlapped. It is possible to develop almost all colors by using only the pigments of three primary colors and as necessary black pigment, and printing steps can be markedly reduced in comparison with a conventional screen printing method. For example, it is not necessary to prepare printing screens corresponding to each printing step unlike a screen printing method, and the number of pigments and working steps can be markedly reduced.

According to the invention, a decorating pigment-transfer film having a very thin thickness of 5 to 25 microns is bonded to a fire-resistant article such as a pottery plate, and a fire-resistant article having uneven surfaces can be successfully decorated.

Because the present invention utilizes direct photographic projection without using a conventional screen printing method, the resulting resolution can be increased by 2 to 5 times.

Also, the present decorating pigment-transfer sheet can be prepared in advance, and thus readily carried and stored.

What is claimed is:

1. A decorating pigment-transfer sheet for decorating heatresistant articles, which comprises a water-absorbing substrate sheet, a water-soluble paste layer placed on the substrate sheet, at least one photosensitive resin layer placed on the paste layer and having adhesive dot photoimages, and a glaze-containing pigment layer deposited on the adhesive dot images of each photosensitive layer, whereby the pigment layer having good gradation and high resolution in compliance with the photo-images.

2. The transfer sheet according to claim 1, in which a plurality of the photosensitive resin layers having different pigments deposited on adhesive dot photo-images are placed on the paste layer.

3. The transfer sheet according to claim 1, in which the dot photo-images are produced on the photosensitive layer by irradiation with actinic rays through a dotted photographic element.

4. The transfer sheet according to claim 3, in which at least three photographic elements color-separated into three primary colors are used to produce the dot photo-images on each of the photosensitive resin layers and the corresponding pigment is deposited on the resulting photo-images of each resin layer.

5. The transfer sheet according to claim 1, in which the thickness of each pigment layer is not more than 6 microns.

6. The transfer sheet according to claim 1, in which a transparent glaze layer is provided on the top pigment layer.

7. The transfer sheet according to claim 1, in which a top protecting combustible layer is provided on the transfer sheet.

8. The transfer sheet according to claim 2, in which the thickness of each pigment layer is not more than 6 microns.

9. The transfer sheet according to claim 2, in which a transparent glaze layer is provided on the top pigment layer.

10. The transfer sheet according to claim 3, in which the thickness more than 6 microns.

11. The transfer sheet according to claim 4, in which the thickness of each pigment layer is not more than 6 microns.

12. The transfer sheet according to claim 4, in which a transparent glaze layer is provided on the top pigment layer.

13. The transfer sheet according to claim 4, in which a top protecting combustible layer is provided on the transfer sheet.

14. A method for decorating a heat-resistant article with a glaze-containing pigment pattern, which comprises soaking in water a decorating pigment-transfer sheet comprising a water-absorbing substrate sheet, a water-soluble paste layer placed on the substrate sheet, at least one photosensitive resin layer placed on the paste layer and having adhesive dot photo-images, and a glaze-containing pigment layer deposited on the adhesive dot images of each photosensitive layer;

removing the substrate sheet from the transfer sheet, placing the remaining transfer sheet on the surface of the heat-resistant article, removing excess paste and water from the sheet, and drying the resulting sheet and article; and firing the sheet and article at a temperature sufficient to burn away the photo-sensitive resin layer(s) and bond the pigment(s) onto the surface of the article, whereby the resulting pigment pattern having good gradation and high resolution in compliance with the photo-images.

15. The method according to claim 14, in which the thickness of each pigment layer is not more than 6 microns.

16. The method according to claim 14, in which a transparent glaze layer is provided on the top pigment layer.

17. The method according to claim 14, in which the transfer sheet comprises a plurality of the photosensitive resin layers having different pigments deposited on the adhesive dot photoimages.

18. The method according to claim 17, in which the thickness of each pigment layer is not more than 6 microns.

19. The method according to claim 17, in which at least three photographic elements color-separated into three primary colors are used to produce the dot photo-images on each of the photo-sensitive resin layers and the corresponding pigment is deposited on the resulting images of each resin layer.

20. The method according to claim 19, in which the thickness of each pigment layer is not more than 6 microns.

* * * * *